(12) United States Patent
Yan et al.

(10) Patent No.: US 12,178,057 B2
(45) Date of Patent: Dec. 24, 2024

(54) COMPOSITE INTERFACE TRANSPORT MATERIAL-BASED PEROVSKITE PHOTOVOLTAIC, LIGHT EMISSION AND LIGHT DETECTION MULTI-FUNCTIONAL DEVICE AND PREPARATION METHOD THEREFOR

(71) Applicant: SOUTH CHINA UNIVERSITY OF TECHNOLOGY, Guangzhou (CN)

(72) Inventors: Keyou Yan, Guangzhou (CN); Jiangsheng Xie, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 598 days.

(21) Appl. No.: 17/608,983

(22) PCT Filed: May 18, 2020

(86) PCT No.: PCT/CN2020/090745
§ 371 (c)(1),
(2) Date: Nov. 4, 2021

(87) PCT Pub. No.: WO2020/228832
PCT Pub. Date: Nov. 19, 2020

(65) Prior Publication Data
US 2022/0231242 A1    Jul. 21, 2022

(30) Foreign Application Priority Data
May 16, 2019   (CN) .......................... 201910406992.0

(51) Int. Cl.
*H10K 30/35* (2023.01)
*C09K 11/02* (2006.01)
(Continued)

(52) U.S. Cl.
CPC ............ *H10K 30/35* (2023.02); *C09K 11/025* (2013.01); *C09K 11/661* (2013.01); *H10K 71/12* (2023.02);
(Continued)

(58) Field of Classification Search
CPC ...... H10K 30/35; H10K 71/12; H10K 50/115; H10K 50/15; H10K 50/16; H10K 71/00; H10K 30/50; H10K 85/50
See application file for complete search history.

(56) References Cited

U.S. PATENT DOCUMENTS

2017/0358398 A1* 12/2017 Beaumont ............ H10K 85/215
2018/0005762 A1*  1/2018 Zhu ....................... H10K 85/113
(Continued)

FOREIGN PATENT DOCUMENTS

| CN | 106573791 | 4/2017 |
|----|-----------|--------|
| CN | 08389977  | 8/2018 |

(Continued)

OTHER PUBLICATIONS

"International Search Report (Form PCT/ISA/210) of PCT/CN2020/090745", mailed on Aug. 26, 2020, with English translation thereof, pp. 1-6.

(Continued)

*Primary Examiner* — David Vu
*Assistant Examiner* — Brandon C Fox
(74) *Attorney, Agent, or Firm* — JCIPRNET

(57) ABSTRACT

A composite interface transport material-based perovskite photovoltaic, light emission and light detection multi-functional device and a preparation method therefor. The multi-functional device comprises a transparent conductive glass, a composite electron transport layer, a perovskite active layer, a composite hole transport layer and a metal electrode layer which are sequentially arranged in a stacked manner
(Continued)

from bottom to top. The work functions of the interface transport layers are adjusted by means of the multi-element interface transport materials, so that the work functions of the electron transport layer and the hole transport layer are respectively levelled with conduction band and valence band positions of the perovskite active layer. According to experiment result comparisons, the photoelectric conversion efficiency and the luminous efficiency of the perovskite multifunctional device, after energy band regulation, are significantly increased.

17 Claims, 7 Drawing Sheets

(51) Int. Cl.
| | |
|---|---|
| C09K 11/66 | (2006.01) |
| H10K 30/50 | (2023.01) |
| H10K 50/15 | (2023.01) |
| H10K 50/16 | (2023.01) |
| H10K 71/12 | (2023.01) |
| B82Y 20/00 | (2011.01) |
| B82Y 30/00 | (2011.01) |
| B82Y 40/00 | (2011.01) |
| H10K 50/115 | (2023.01) |
| H10K 71/00 | (2023.01) |
| H10K 85/50 | (2023.01) |
| H10K 102/00 | (2023.01) |

(52) U.S. Cl.
CPC ............... *B82Y 20/00* (2013.01); *B82Y 30/00* (2013.01); *B82Y 40/00* (2013.01); *H10K 30/50* (2023.02); *H10K 50/115* (2023.02); *H10K 50/15* (2023.02); *H10K 50/16* (2023.02); *H10K 71/00* (2023.02); *H10K 85/50* (2023.02); *H10K 2102/00* (2023.02)

(56) References Cited

U.S. PATENT DOCUMENTS

2018/0351123 A1* 12/2018 Saliba .................... H10K 30/87
2020/0388442 A1* 12/2020 Tavakoli .............. H01G 9/2059

FOREIGN PATENT DOCUMENTS

| | | |
|---|---|---|
| CN | 109638165 | 4/2019 |
| CN | 110190195 | 8/2019 |
| WO | 2018234878 | 12/2018 |

OTHER PUBLICATIONS

Jiangsheng Xie et al., "Enhanced Electronic Properties of SnO2 via Electron Transfer from Graphene Quantum Dots for Efficient Perovskite Solar Cells," ACS Nano, vol. 11, Aug. 2017, pp. 9176-9182.

* cited by examiner

COMPOSITE INTERFACE TRANSPORT MATERIAL-BASED PEROVSKITE PHOTOVOLTAIC, LIGHT EMISSION AND LIGHT DETECTION MULTI-FUNCTIONAL DEVICE AND PREPARATION METHOD THEREFOR

CROSS-REFERENCE TO RELATED APPLICATION

This application is a 371 of international application of PCT application serial no. PCT/CN2020/090745, filed on May 18, 2020, which claims the priority benefits of China application no. 201910406992.0, filed on May 16, 2019. The entirety of each of the above-mentioned patent applications is hereby incorporated by reference herein and made a part of this specification.

TECHNICAL FIELD

The present invention belongs to the photoelectric field of perovskite, and particularly relates to a composite interface transport material-based perovskite photovoltaic, light emission and light detection multi-functional device and a preparation method thereof.

DESCRIPTION OF RELATED ART

In recent years, organic/inorganic halide perovskite materials have lots of advantages, such as, high light absorption coefficient, long carrier lifetime, adjustable bandgap and low cost, and thus become the research focus in the photoelectric field. The solar cell and light emitting diode based on the material have achieved great progress, and gradually exhibited good application prospect. According to the statistics of the National Renewable Energy Laboratory (NREL), the maximum certified power conversion efficiency of the perovskite solar cell has been up to 23.7%. It is reported by the latest Nature that the external quantum efficiency of perovskite light-emitting diode has been over 20%. Moreover, the device may achieve light detection functions, and it is a greatly significant research topic whether multiple functions may be combined, that is, multiple functions are achieved in a device, so as to prepare a perovskite multi-functional device possessing photovoltaic properties, light emission and light detection, such that the multi-functional device can sensitively respond to optical signal to achieve high-efficiency power generation under solar illumination and low-energy light emission in the dark.

Perovskite solar cell and light emitting diode have the similar device structure, but they have reverse energy conversion process under working conditions. FIG. 2b and FIG. 2c compare the energy band configuration of a solar cell (FIG. 2b) and a light emitting diode (FIG. 2c). Solar cells are arranged in a form of staggered energy band, that is, the conduction band of a perovskite active layer is higher than the conduction band of an electron transport layer (the lowest unoccupied molecular orbital), and the valence band is lower than the valence band of a hole transport layer (the highest occupied molecular orbital), as shown in FIG. 2b. Such kind of energy band structure is beneficial to the effective extraction of photon-generated carriers in the active layer into the electron transport layer and the hole transport layer. Light emitting diodes are arranged in a form of crossover energy band, that is, the conduction band of a perovskite active layer is lower than the conduction band of an electron transport layer (the lowest non-occupied molecular orbital), and the valence band is higher than the valence band of a hole transport layer (the highest occupied molecular orbital), as shown in FIG. 2c. Such kind of energy band structure is beneficial to the injection of charges to the perovskite active layer from the electron transport layer and the hole transport layer, thereby achieving radiative recombination light emission in the active layer. For a photodetector, dark current needs to be reduced and so on. Therefore, such two kinds of devices demand for the not exactly same energy band configuration from the aspect of energy band configuration. The preparation of a multi-functional perovskite device integrated with high photoelectric conversion efficiency, high electroluminescence efficiency and high detection sensitivity becomes a challenge.

SUMMARY

Technical Problem

Since the solar cells, light emitting diodes and photoelectric detectors based on heterogeneous structure have different energy band configuration modes of each functional layer in different devices, it is difficult to achieve high-performance photovoltaic properties, light emission and light detection performance in a same device at the same time. The present invention aims at proposing a composite interface transport material-based perovskite photovoltaic, light emission and light detection multi-functional device and a preparation method thereof, thus eliminating a potential barrier between the perovskite active layer and the transport layer via energy-band engineering, and an energy band structure is designed, as shown in FIG. 2a. The energy band structure may simultaneously and effectively improve the photovoltaic efficiency, luminous efficiency and light detection sensitivity of the perovskite multi-functional device.

Solutions for the Problem

Technical Solution

The objective of the present invention is achieved by one of the following technical solutions.

Provided is a composite interface transport material-based perovskite photovoltaic, light emission and light detection multi-functional device, and the multi-functional device comprises a transparent conductive glass, a composite electron transport layer, a perovskite active layer, a composite hole transport layer and a metal electrode layer which are sequentially arranged in a stacked manner from bottom to top.

Further, the transparent conductive electrode layer is an ITO or FTO transparent conductive glass; specifically, the transparent conductive electrode has a square resistance of 8-15Ω, a light transmittance of 85-90%, and the transparent conductive glass has a thickness of 1.1-2.2 mm.

Further, the metal electrode layer is gold, silver, copper or aluminum. Specifically, the metal electrode layer is deposited on the hole transport layer by thermal evaporation and has a thickness of 0.1-1000 nm.

Further, the composite electron transport layer has a thickness of 5-120 nm; the composite electron transport layer is a $SnO_2(Cl):GQDs$ or $TiO_2(Cl):GQDs$ film, specifically, including an amino-graphene quantum dot and further including stannic oxide or titanium dioxide prepared from a chlorine salt, and a mass ratio of the chlorine salt to the amino-graphene quantum dot ranges from 10:1 to 1000:1.

The stannic oxide or titanium dioxide prepared from a chlorine salt refers to $SnO_2$ or $TiO_2$ containing partial Cl residues. Moreover, the composite electron transport layer has a thickness of 5-120 nm.

Further, the perovskite active layer is one or more of $CH_3NH_3PbX_3$, $NH_2CH_2NH_3PbX_3$ or $CsPbX_3$, and X is I or Br; and the perovskite active layer has a thickness of 50-600 nm.

Further, the composite hole transport layer is spiro-OMeTAD:FN—Br composited by tetra[N,N-bi(4-methoxyphenyl)amino]-9,9'-spiro-OMeTAD and 2,7-dibromo-9,9-bis[3-(dimethylamino)propyl]fluorene (FN—Br), and a mass ratio of spiro-OMeTAD to FN—Br is 10-1000:1, and the composite hole transport layer has a thickness of 20-200 nm.

Further, FN—Br can be replaced by TFB or F8BT which have a work function greater than 5.4 eV.

The present invention further provides a preparation method of the above multi-functional device, including the following steps:

(1) Cleaning of the Transparent Conductive Glass

Performing ultrasonic cleaning on a conductive glass, drying the conductive glass with nitrogen or compressed air, then performing surface cleaning treatment by an ultraviolet light to remove organic matters and enhance film-forming property;

(2) Preparation of the Composite Electron Transport Layer

Preparing a precursor solution from stannous chloride, stannic chloride or titanium tetrachloride, then adding amino-graphene quantum dots for mixing, and spin coating a mixed solution on the transparent conductive glass, then performing heat treatment, and performing ultraviolet ozonation treatment after cooling, where a dangling bond formed by the ultraviolet ozonation treatment could enhance the subsequent film-forming property;

(3) Preparation of the Perovskite Active Layer spin coating a perovskite precursor solution on the composite electron transport layer, and dropwise adding an antisolvent for continuous spin coating when the solvent is wet, and performing heat treatment on the spin coated perovskite film;

(4) Preparation of the Composite Hole Transport Layer

Spin coating a mixed solution of spiro-OMeTAD and FN—Br on a surface of the perovskite active layer;

(5) Preparation of a Metal Electrode

Evaporating gold or silver on the composite hole transport layer under vacuum conditions to obtain the perovskite-based photovoltaic, light-emitting and light detection multi-functional device.

Further, in the step (1), the conductive glass is subjected to ultrasonic cleaning for 5-10 min successively in deionized water, a liquid detergent, acetone and an ethanol solution, then the ITO or FTO conductive glass is dried by nitrogen or compressed air, and treated for 10-30 min by an UV-ozone cleaner.

Further, in the step (2), specifically, the mixed solution is coated on a substrate of the transparent conductive glass for 30-60 s at a rotary speed of 2000-5000 rpm. Finally, the spin-coated film is put on a hot plate and heated for 0.5-2 h at 180-270° C., cooled and put to ultraviolet ozone to be treated for 5-15 min; a solvent of the mixed solution is ethanol, stannous chloride or stannic chloride has a concentration of 0.1%-10 wt %, and the amino-graphene quantum dot has a concentration of 0.01-1 wt %.

Further, in the step (3), $PbI_2$, $NH_2CH_2NH_3I$ (or $CH_3NH_3I$, and the like) and DMSO are dissolved into a DMF solution according to a molar ratio of 1:1:1, and the concentration is 1.25-1.6 mol/ml. After dissolving, the perovskite precursor solution is dropped on the composite electron transport layer for spin coating at 3000-5000 rpm, and 100-1000 μL diethyl ether is added dropwise at 20-25 s. The spin-coated perovskite film is put on a 100-120° C. hot plate for heat treatment for 5-30 min.

Further, in the step (4), the mixed solution of spiro-OMeTAD and FN—Br is obtained by dissolving spiro-OMeTAD and FN—Br powder into chlorobenzene, and spiro-OMeTAD has a mass concentration of 1-10 wt %, and FN—Br has a mass concentration of 0.01-1 wt %. Moreover, spin coating conditions are as follows: spin coating is performed for 35-60 s at a rotary speed of 3000-5000 rpm.

Further, the antisolvent is methylbenzene, chlorobenzene or diethyl ether.

The energy band configuration of the composite electron transport layer, the perovskite active layer and the composite hole transport layer in the present invention is shown in FIG. 2a, and the specific control idea is shown in FIG. 3; and the core idea is to utilize an electron transport material with a greater work function to be matched with an electron transport material with a small work function, thus obtaining levelled quasi-fermi level with the perovskite conduction band, and eliminating the charge transfer potential barrier on the contact interface between the composite electron transport layer and the perovskite luminous layer, namely, making the electron transfer potential barrier on the contact interface zero (see the dashed box in FIG. 3); electrons may be not only injected into a perovskite layer, but also extracted, and the potential barrier on the electron and hole transfer interface is zero, which may achieve charge injection and extraction. Further, a hole transport material (e.g., FN—Br) with a larger work function may be utilized to be matched with a hole transport material (e.g., spiro-OMeTAD) with a small work function, and the work function of the composite material is adjusted to be levelled with the quasi-fermi level of the perovskite valence band, thus eliminating the charge transfer potential barrier on the contact interface between the composite electron transport layer and the perovskite luminous layer, that is, making the hole transfer potential barrier on the contact interface zero (see the dashed box in FIG. 3), and holes may be not only injected into a perovskite layer, but also extracted. The composite electron transport layer and composite hole transport layer composited by a plurality of transport materials are matched with a perovskite active layer to obtain a perovskite multi-functional device with high overall performance, such that the device forms an energy band structure configuration close to zero charge transfer potential barrier as shown in FIG. 2a, thus inhibiting nonradiative recombination, and finally substantially improving the photoelectric conversion efficiency, luminous efficiency and light detection performance of the perovskite multi-functional device.

Beneficial Effects of the Invention

Beneficial Effects

Compared with the prior art, the present invention has the following beneficial effects:

compared with the conventional perovskite solar cell and light emitting diode, what is different in the present invention is to achieve the charge injection into an active layer under external voltage and to achieve charge extraction from the active layer under light illumination by eliminating an energy band potential barrier between a perovskite active layer and a transport layer, thereby preparing a perovskite multi-functional device integrated with high photoelectric conversion efficiency, high luminous efficiency and high detection sensitivity.

The key technology is to utilize composite electrons/hole materials to achieve energy band control; multi-element electron transport materials are respectively doped and composited with hole transport materials to effectively control the work functions of the electron transport layer and the hole transport layer, thus effectively eliminating the interface potential barrier between perovskite and the transport layer, and inhibiting the nonradiative recombination at the interface. According to experiment result comparisons, the photoelectric conversion efficiency (20.45%) and the luminous efficiency (EQE, 4.3%) of the perovskite multi-functional device, with energy band regulated, are significantly increased.

BRIEF DESCRIPTION OF THE DRAWINGS

Description of the Drawings

Figure 1:
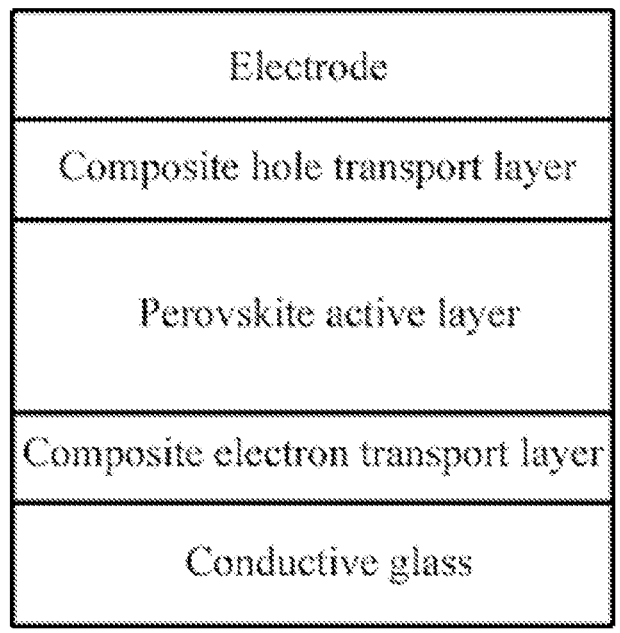
Figure 2B:
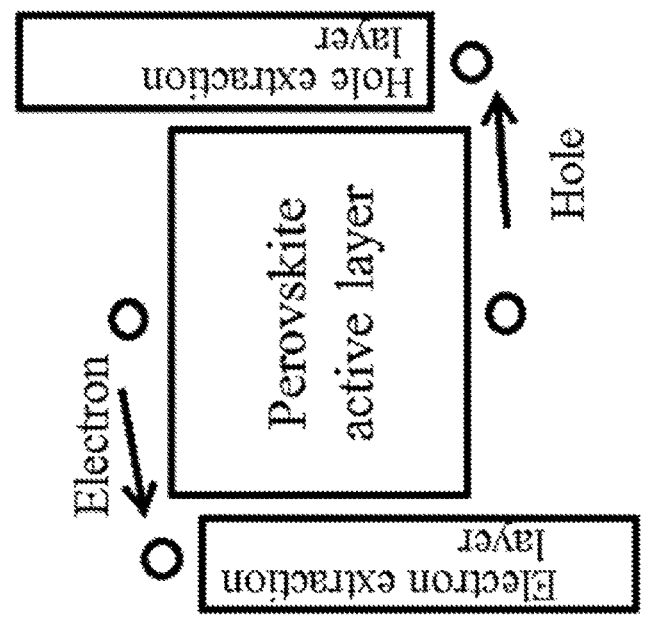
Figure 2A:
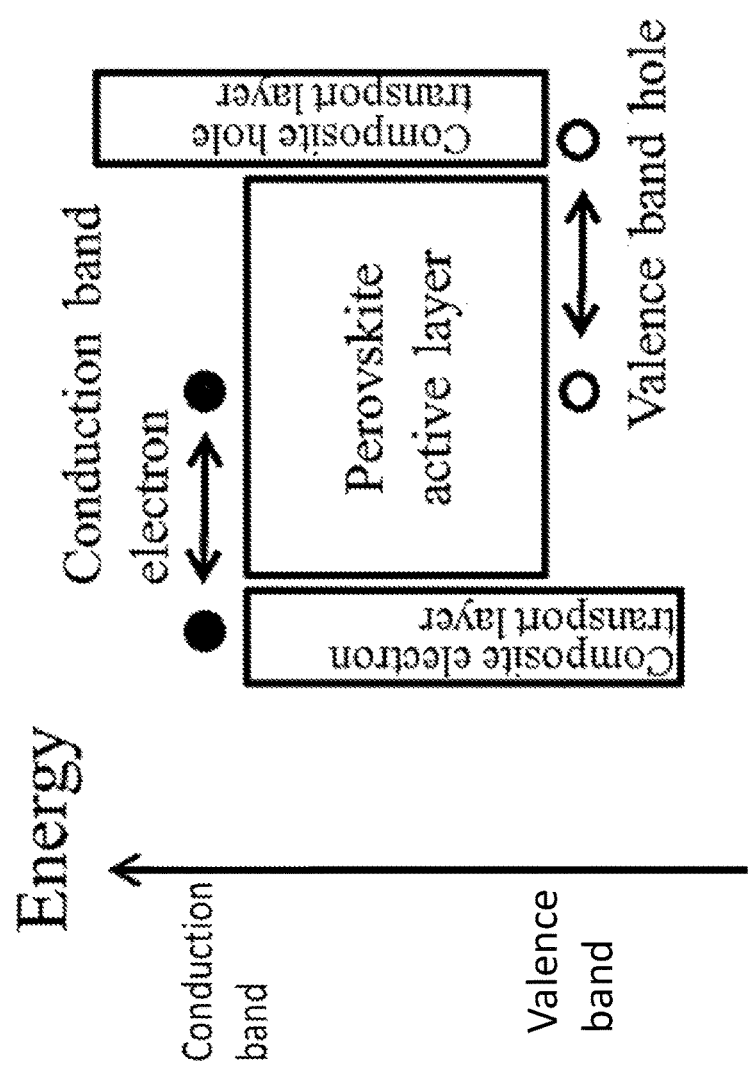
Figure 2C:
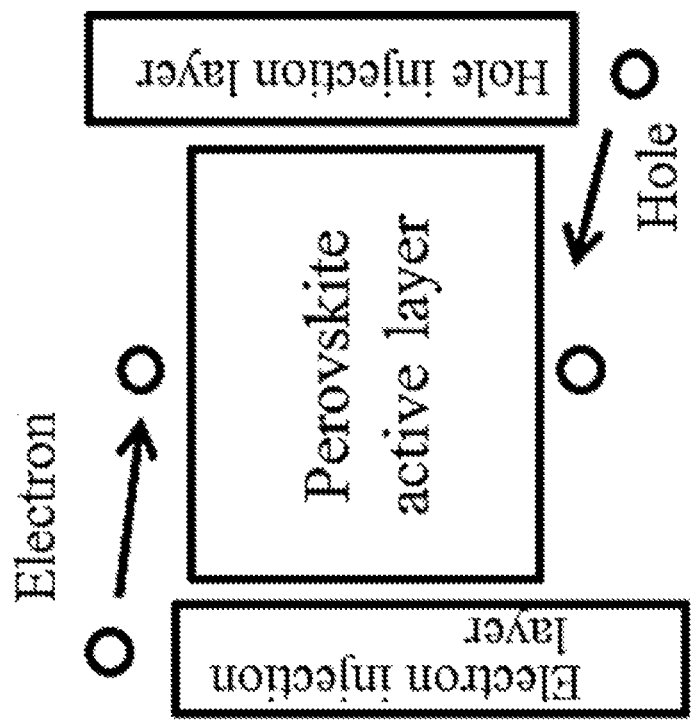
Figure 3:
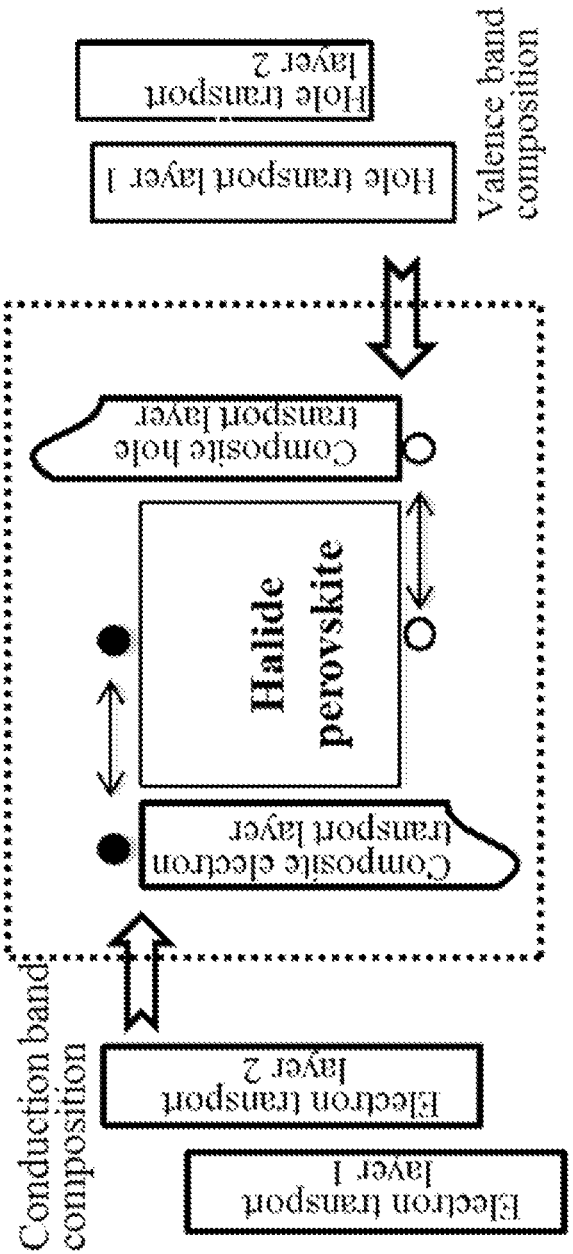
Figure 4:
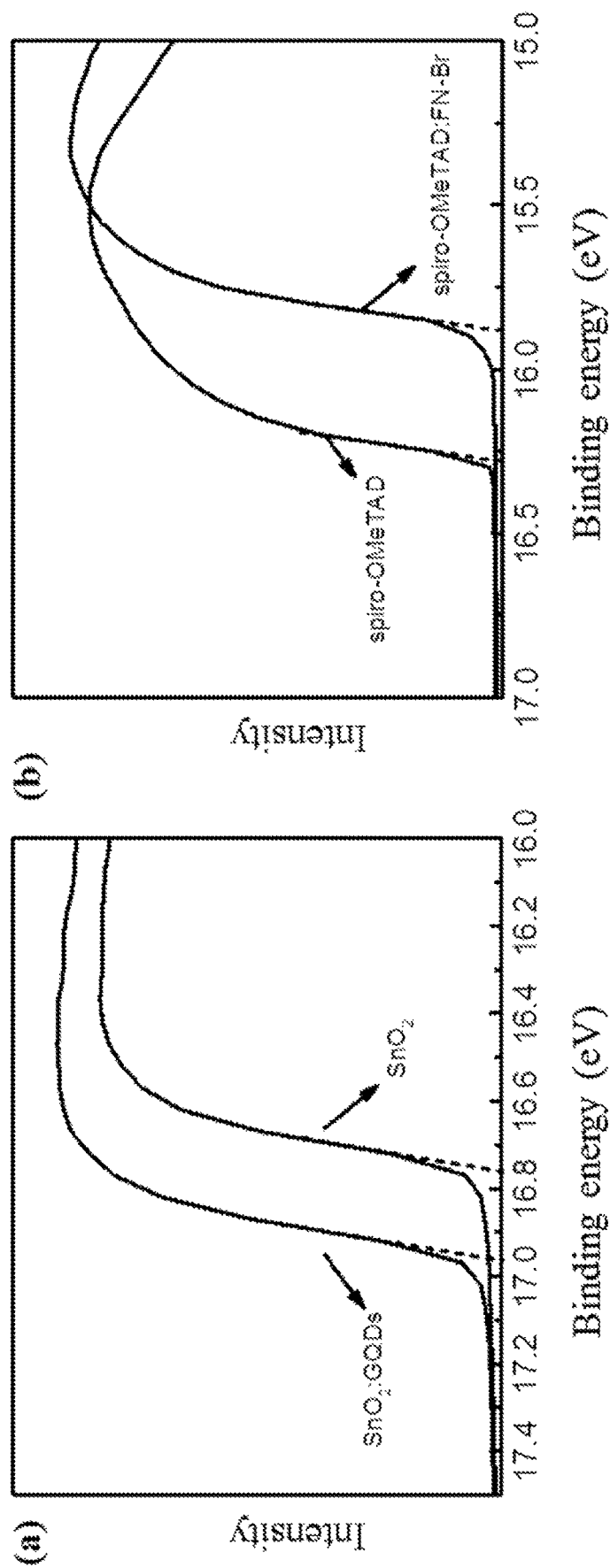
Figure 5:
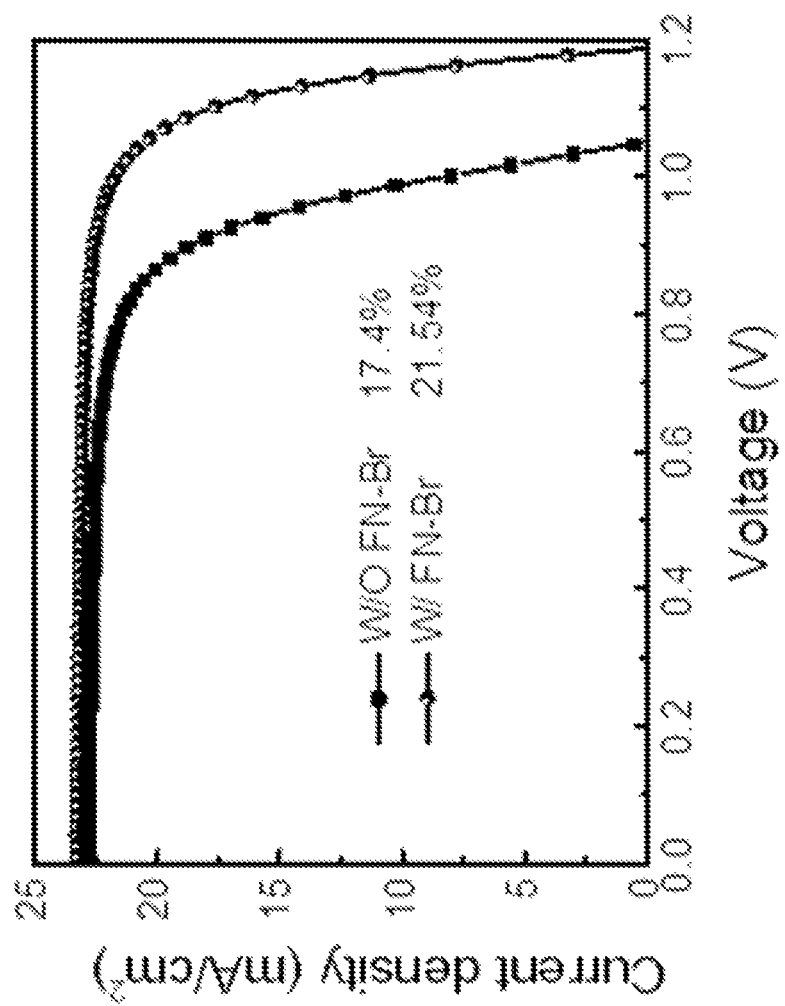
Figure 6:
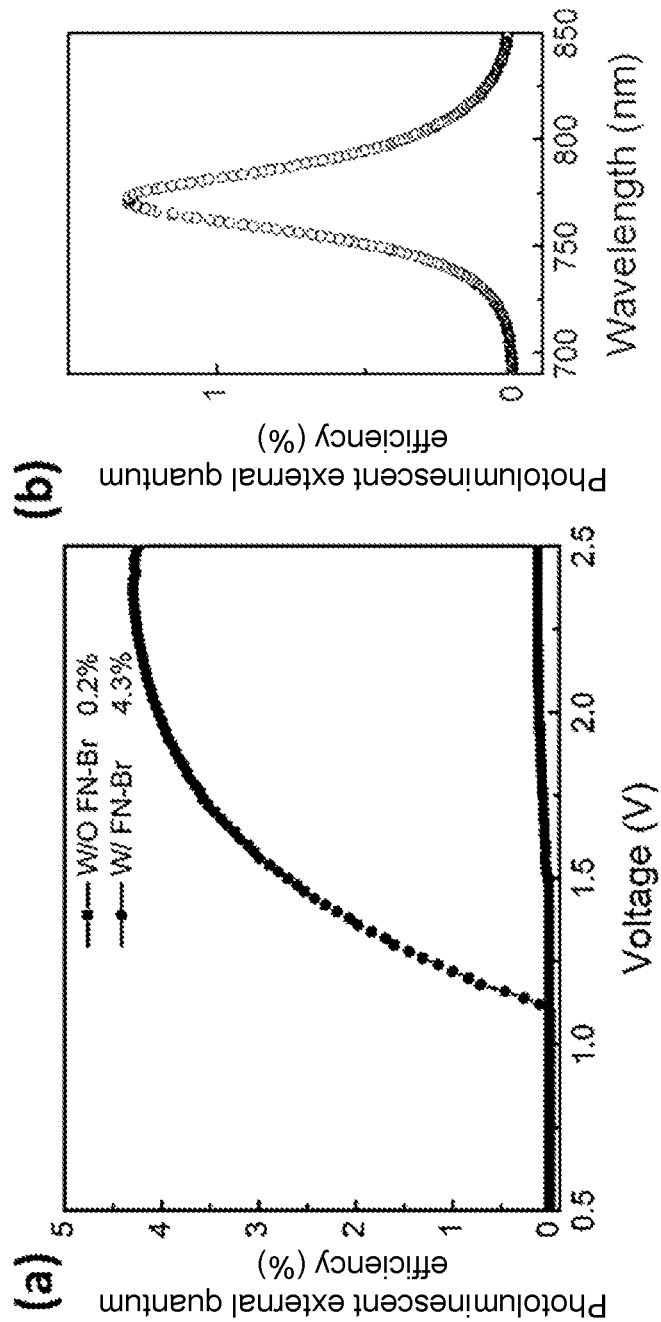

FIG. 1 shows a structure diagram of a composite interface transport material-based perovskite photovoltaic, light emission and light detection multi-functional device in the present invention;

FIG. 2a shows a structural schematic diagram of an energy band of the perovskite multi-functional device in the present invention;

FIG. 2b shows a structural schematic diagram of an energy band of a solar cell;

FIG. 2c shows a structural schematic diagram of an energy band of a light emitting diode;

FIG. 3 is a diagram showing a structure and working principle of the perovskite multi-functional device in Example 1 of the present invention;

FIG. 4 shows an energy band diagram of an electron transport layer and a hole transport layer of the perovskite multi-functional device in Example 1 of the present invention;

FIG. 5 shows an I-V graph of the perovskite multi-functional device in Example 1 of the present invention under AM1.5 light illumination;

FIG. 6 shows a photoresponse diagram of the perovskite multi-functional device in Example 1 of the present invention under AM1.5 light illumination.

DESCRIPTION OF THE EMBODIMENTS

Detailed Description of the Embodiments

The present invention will be further described in detail with reference to the specific examples, which is used to explain the present invention, but not limited thereto.

Example 1

As shown in FIG. 1, a perovskite-based photovoltaic, light-emitting and light detection multi-functional device includes a transparent conductive glass, a composite electron transport layer, a perovskite active layer, a composite hole transport layer and a metal electrode layer which are sequentially arranged in a stacked manner from bottom to top.

A preparation method of the perovskite-based photovoltaic, light-emitting and light detection multi-functional device includes the following steps:

(1) Cleaning of an ITO glass: an ITO glass having a square resistance of 10Ω, light transmittance of 90% and a thickness of 1.1 mm was chosen, and subjected to ultrasonic cleaning for 5 min successively in deionized water, a liquid detergent, acetone and an ethanol solution, then the ITO glass was dried by nitrogen, and treated for 20 min by an UV-ozone cleaner.

(2) Preparation of the composite electron transport layer: 23 mg $SnCl_2 \cdot 2H_2O$ and 0.4 mg amino-graphene quantum dots were dissolved into 1 mL ethanol solution (the amino-graphene quantum dot had a concentration of 0.05 wt %, stannous chloride had a concentration of 2.4 wt %, and a mass ratio of stannous chloride to the amino-graphene quantum dot was 190:4), after being dissolved fully, the solution was spin coated on an ITO substrate for 30 s at a rotary speed of 3000 rpm. Finally, the spin coated film was put on a hot plate and heated for 1 h at 230° C., after cooling, put to ultraviolet ozone to be treated for 5 min, thus forming the composite electron transport layer, and the composite electron transport layer had a thickness of 40 nm;

(3) Preparation of a perovskite film:$PbI_2$, $CH_3NH_3I$ and DMSO were dissolved into DMF according to a molar ratio of 1:1:1 to obtain a perovskite precursor solution having a concentration of 1.45 mol/ml. After fully dissolving, the perovskite precursor solution was dropped on $SnO_2$. After spin coating was performed for 10 s at 1000 rpm, the rotary speed was increased to 5000 rpm, and 600 μL diethyl ether was dropwise added at 20-22 s. The spin-coated perovskite film was put on a 100° C. hot plate for heat treatment for 10 min.

(4) Preparation of the composite hole transport layer: 24 mg spiro-OMeTAD, 0.05 mg FK209 and 1 mg FN—Br powder were dissolved into 1 mL chlorobenzene solvent (spiro-OMeTAD had a mass concentration of 2.1%, FN—Br had a mass concentration of 0.09%, and a mass ratio of spiro-OMeTAD to FN—Br was 24:1). Finally, the spiro-OMeTAD mixed solution was dropped on a surface of the perovskite film, and spin coated for 35 s at a rotary speed of 3000 rpm, and the composite hole transport layer had a thickness of 60 nm;

(5) Preparation of a metal electrode:gold was evaporated on the spiro-OMeTAD film under a vacuum condition of $1.0 \times 10^{-3}$ Pa, and prepared into a metal electrode having a thickness of 100 nm;

The above steps were finished to obtain the perovskite-based photovoltaic, light-emitting and light detection multi-functional device.

The performance of the perovskite multi-functional device obtain in the example was shown in FIG. 4. (a) in FIG. 4 shows an energy band diagram of the composite electron transport layer; (b) in FIG. 4 shows an energy band diagram of the composite hole transport layer; after doping with amino-graphene quantum dots, the work function of the $SnO_2$ electron transport layer reduced to 4.25 eV from 4.45 eV. After doping with FN—Br, the work function of spiro-OMeTAD was increased to 5.1 eV from 4.5 eV. The reverse-scanning photoelectric efficiency of the multi-functional device was 21.54%, and the forward scanning result was 20.88%, as shown in FIG. 5. The luminous efficiency of the device before and after optimization was respectively 0.2% and 4.3%, as shown in (a) in FIG. 6, and (b) in FIG. 6 was fluorescence emission spectrum of the multi-functional device, and the light emission peak position was 772 nm.

Example 2

In this example, the transparent electrode used was an FTO conductive glass. Other steps were the same as those in Example 1, and the reverse-scanning photoelectric efficiency was 20.8% and the forward scanning result was 20.2%. The luminous efficiency was 1.8%.

Example 3

A preparation method of a perovskite-based photovoltaic, light-emitting and light detection multi-functional device includes the following steps:
(1) Cleaning of an ITO glass: an ITO glass having a square resistance of 10Ω, light transmittance of 90% and a thickness of 1.1 mm was chosen, and subjected to ultrasonic cleaning for 5 min successively in deionized water, a liquid detergent, acetone and an ethanol solution, then the ITO glass was dried by nitrogen, and treated for 20 min by an UV-ozone cleaner.
(2) Preparation of the composite electron transport layer: 23 mg $SnCl_2 \cdot 2H_2O$ and 0.5 mg amino-graphene quantum dots were dissolved into 1 mL ethanol solution (the amino-graphene quantum dot had a concentration of 0.06 wt %, stannous chloride had a concentration of 2.4 wt %, and a mass ratio of stannous chloride to the amino-graphene quantum dot was 38:1), after being dissolved fully, the solution was spin coated on an ITO substrate for 30 s at a rotary speed of 3000 rpm. Finally, the spin coated film was put on a hot plate and heated for 1 h at 200° C., after cooling, put to ultraviolet ozone to be treated for 5 min, and the composite electron transport layer had a thickness of 40 nm;
(3) Preparation of a perovskite film: $PbI_2$, $NH_2CH_2NH_3I$ (or $CH_3NH_3I$, and the like) and DMSO were dissolved into a DMF solution according to a ratio of 1:1:1, and the concentration was 1.45 mol/ml. After the solution was dissolved fully, the perovskite precursor solution was dropped on $SnO_2$. Spin coating was performed for 10 s at 1000 rpm, the rotary speed was increased to 5000 rpm, and 600 μL diethyl ether was dropwise added at 20-22 s. The spin-coated perovskite film was put on a 100° C. hot plate for heat treatment for 10 min.
(4) Preparation of the composite hole transport layer: 75 mg spiro-OMeTAD, 0.05 mg FK209 and 2 mg FN—Br powder were dissolved into 1 mL chlorobenzene solvent (spiro-OMeTAD had a mass concentration of 6.3%, FN—Br had a mass concentration of 0.17%, and a mass ratio of spiro-OMeTAD to FN—Br was 75:2). Finally, the Spiro-OMeTAD mixed solution was dropped on a surface of the perovskite film, and spin coated for 35 s at a rotary speed of 3000 rpm, and the composite hole transport layer had a thickness of 200 nm;
(5) Preparation of a metal electrode: gold was evaporated on the spiro-OMeTAD film under a vacuum condition of $1.0 \times 10^{-3}$ Pa, and prepared into a metal electrode having a thickness of 100 nm;

The above steps were finished to obtain the perovskite-based photovoltaic, light-emitting and light detection multi-functional device.

The reverse-scanning photoelectric efficiency of the perovskite multi-functional device obtained in this example was 20.7%, and forward scanning result was 20.4%. The luminous efficiency was 4.2%.

Example 4

In this example, $SnO_2$ heat treatment temperature was 230° C. Other steps were the same as those in Example 3, the reverse-scanning photoelectric efficiency of the perovskite multi-functional device obtained in this example was 21.1%, and forward scanning result was 20.7%, and the luminous efficiency was 2.9%.

Example 5

In this example, 75 mg spiro-OMeTAD, 0.05 mg FK209 and 0.75 mg FN—Br powder were dissolved into 1 mL chlorobenzene solvent (through calculation, spiro-OMeTAD had a mass concentration of 6.3%, FN—Br had a mass concentration of 0.063%, and a mass ratio of spiro-OMeTAD to FN—Br was 100:1). Other steps were the same as those in Example 3, the reverse-scanning photoelectric efficiency of the perovskite multi-functional device obtained in this example was 21.3%, and forward scanning result was 20.1%, and the luminous efficiency was 2.2%.

Example 6

In this example, 10 mg amino-graphene quantum dots and 100 mg stannous chloride were dissolved into 1 mL ethanol solution. 2 mg FN—Br and 100 mg spiro-OMeTAD were dissolved into 1 mL chlorobenzene (through calculation, the amino-graphene had a concentration of 0.01 wt %, stannous chloride had a concentration of 0.1 wt %, and a mass ratio of stannous chloride to the amino-graphene quantum dots was 10:1, FN—Br had a concentration of 0.16 wt %, spiro-OMeTAD had a concentration of 8.3 wt %, and a mass ratio of spiro-OMeTAD to FN—Br was 50:1). Other steps were the same as those in Example 3, the reverse-scanning photoelectric efficiency of the perovskite multi-functional device obtained in this example was 20.4%, and the forward scanning result was 19.6%, and the luminous efficiency was 2.8%.

Example 7

In this example, 0.09 mg amino-graphene quantum dots and 910 mg stannous chloride were dissolved into 1 mL ethanol solution, and 12.3 mg FN—Br and 123 mg spiro-OMeTAD were dissolved into 1 mL chlorobenzene (through calculation, in this example, the amino-graphene had a concentration of 0.01 wt %, stannous chloride had a concentration of 10 wt, and a mass ratio of the two was 1:1000, spiro-OMeTAD had a concentration of 10 wt %, FN—Br had a concentration of 1 wt %, and a mass ratio of the two was 10:1); other steps were the same as those in Example 3. The reverse-scanning photoelectric efficiency of the perovskite multi-functional device obtained in this example was 20.1%, and the forward scanning result was 19.3%, and the light-emitting external quantum efficiency was 2.1%.

Example 8

In this example, 9 mg amino-graphene quantum dots and 91 mg stannous chloride were dissolved into 1 mL ethanol solution, and 0.123 mg FN—Br and 123 mg spiro-OMeTAD were dissolved into 1 mL chlorobenzene (through calculation, in this example, the amino-graphene had a concentration of 1 wt %, stannous chloride had a concentration of 10 wt, and a mass ratio of the two was 1:10, spiro-OMeTAD had a concentration of 10 wt %, FN—Br had a concentration of 0.01 wt %, and a mass ratio of the two was 1000:1); other steps were the same as those in Example 3. The reverse-scanning photoelectric efficiency of the perovskite multifunctional device obtained in this example was 19.8%, and the forward scanning result was 19.0%, and the luminous efficiency was 1.9%.

Comparative Example 1

In this example, no FN—Br was added in the preparation of a hole transport layer, and other steps were the same as those in Example 1. The performance result of the obtained device was shown in FIGS. 5 and 6; the reverse-scanning photoelectric efficiency was 17.4%, and the forward scanning result was lower than 15%, and the luminous efficiency was only 0.2%.

Comparative Example 2

In this example, no graphene quantum dot was added in the preparation of an electron transport layer, and other steps were the same as those in Example 1. The performance result of the obtained device was shown in FIGS. 5 and 6; the reverse-scanning photoelectric efficiency was 20.2%, and the forward scanning result was lower than 19.5%, and the luminous efficiency was only 1.7%.

The specific examples above are used to describe the technical solution and beneficial effects of the present invention. It should be understood that the above examples are merely detailed embodiments of the present invention, but are not intended to limit the present invention. Any amendment, equivalent replacement, improvement and the like made within the spirit and principle of the present invention shall be included within the protection scope of the present invention.

What is claimed is:

1. A composite interface transport material-based perovskite photovoltaic, light emission and light detection multi-functional device, the light detection multi-functional device comprises a transparent conductive electrode layer, a composite electron transport layer, a perovskite active layer, a composite hole transport layer and a metal electrode layer which are sequentially arranged in a stacked manner from bottom to top,
wherein the composite electron transport layer has a thickness of 5-120 nm; the composite electron transport layer is made of an amino-graphene quantum dot, and further comprises stannic oxide or titanium dioxide prepared from a chlorine salt, and a mass ratio of the chlorine salt to the amino-graphene quantum dot ranges from 10:1 to 1000:1.

2. The light detection multi-functional device of claim 1, wherein the transparent conductive electrode layer is an ITO or FTO transparent conductive glass; the metal electrode layer is gold, silver, copper or aluminum.

3. A preparation method of the light detection multi-functional device of claim 2, comprising the following steps:
(1) Cleaning of the transparent conductive glass
performing ultrasonic cleaning on a conductive glass, drying the conductive glass with nitrogen or compressed air, then performing surface cleaning treatment by an ultraviolet light to remove organic matters and enhance film-forming property;
(2) Preparation of the composite electron transport layer
Preparing a precursor solution from stannous chloride, stannic chloride or titanium tetrachloride, then adding amino-graphene quantum dots for mixing, and spin coating a mixed solution on the transparent conductive glass, then performing heat treatment, and performing ultraviolet ozonation treatment after cooling, where a dangling bond formed by the ozonation treatment may enhance the subsequent film-forming property;
(3) Preparation of the perovskite active layer
Spin coating a perovskite precursor solution on the composite electron transport layer, and dropwise adding an antisolvent for continuous spin coating when the solvent is wet, and performing heat treatment on the spin coated perovskite film;
(4) Preparation of the composite hole transport layer
Spin coating a mixed solution of spiro-OMeTAD and FN—Br on a surface of the perovskite active layer;
(5) Preparation of a metal electrode
Evaporating gold or silver on the composite hole transport layer under vacuum conditions to obtain the perovskite-based photovoltaic, light-emitting and light detection multi-functional device.

4. The preparation method of claim 3, wherein a solvent in the precursor solution in step (2) is ethanol, and stannous chloride or stannic chloride has a concentration of 0.1-10 wt %, the amino-graphene quantum dot has a concentration of 0.01-1 wt %; and in the step (2), heat treatment refers to heating for 0.5-2 h at 180-270° C., and the ultraviolet ozonation treatment is performed for 5-15 min.

5. The preparation method of claim 3, wherein the mixed solution of spiro-OMeTAD and FN—Br is obtained by dissolving spiro-OMeTAD and FN—Br powder into chlorobenzene, and spiro-OMeTAD has a concentration of 1-10 wt %, and FN—Br has a concentration of 0.01-1 wt %.

6. The light detection multi-functional device of claim 1, wherein the perovskite active layer is one or more of $CH_3NH_3PbX_3$, $NH_2CH_2NH_3PbX_3$ or $CsPbX_3$, and X is I or Br; the perovskite active layer has a thickness of 50-600 nm.

7. A preparation method of the light detection multi-functional device of claim 6, comprising the following steps:
(1) Cleaning of the transparent conductive glass
performing ultrasonic cleaning on a conductive glass, drying the conductive glass with nitrogen or compressed air, then performing surface cleaning treatment by an ultraviolet light to remove organic matters and enhance film-forming property;
(2) Preparation of the composite electron transport layer
Preparing a precursor solution from stannous chloride, stannic chloride or titanium tetrachloride, then adding amino-graphene quantum dots for mixing, and spin coating a mixed solution on the transparent conductive glass, then performing heat treatment, and performing ultraviolet ozonation treatment after cooling, where a dangling bond formed by the ozonation treatment may enhance the subsequent film-forming property;
(3) Preparation of the perovskite active layer
Spin coating a perovskite precursor solution on the composite electron transport layer, and dropwise adding an antisolvent for continuous spin coating when the solvent is wet, and performing heat treatment on the spin coated perovskite film;
(4) Preparation of the composite hole transport layer
Spin coating a mixed solution of spiro-OMeTAD and FN—Br on a surface of the perovskite active layer;
(5) Preparation of a metal electrode
Evaporating gold or silver on the composite hole transport layer under vacuum conditions to obtain the perovskite-based photovoltaic, light-emitting and light detection multi-functional device.

8. The preparation method of claim 7, wherein a solvent in the precursor solution in step (2) is ethanol, and stannous chloride or stannic chloride has a concentration of 0.1-10 wt %, the amino-graphene quantum dot has a concentration of 0.01-1 wt %; and in the step (2), heat treatment refers to heating for 0.5-2 h at 180-270° C., and the ultraviolet ozonation treatment is performed for 5-15 min.

9. The light detection multi-functional device of claim 1, wherein the composite hole transport layer has a thickness of 20-200 nm, and the composite hole transport layer is spiro-OMeTAD:FN—Br composited by spiro-OMeTAD and FN—Br, and a mass ratio of spiro-OMeTAD to FN-Bris 10-1000:1.

10. The light detection multi-functional device of claim 9, wherein in the composite hole transport layer material, FN—Br is replaced by TFB or F8BT having a work function greater than 5.4 eV.

11. A preparation method of the light detection multi-functional device of claim 10, comprising the following steps:
(1) Cleaning of the transparent conductive glass
performing ultrasonic cleaning on a conductive glass, drying the conductive glass with nitrogen or compressed air, then performing surface cleaning treatment by an ultraviolet light to remove organic matters and enhance film-forming property;
(2) Preparation of the composite electron transport layer
Preparing a precursor solution from stannous chloride, stannic chloride or titanium tetrachloride, then adding amino-graphene quantum dots for mixing, and spin coating a mixed solution on the transparent conductive glass, then performing heat treatment, and performing ultraviolet ozonation treatment after cooling, where a dangling bond formed by the ozonation treatment may enhance the subsequent film-forming property;
(3) Preparation of the perovskite active layer
Spin coating a perovskite precursor solution on the composite electron transport layer, and dropwise adding an antisolvent for continuous spin coating when the solvent is wet, and performing heat treatment on the spin coated perovskite film;
(4) Preparation of the composite hole transport layer
Spin coating a mixed solution of spiro-OMeTAD and FN—Br on a surface of the perovskite active layer;
(5) Preparation of a metal electrode
Evaporating gold or silver on the composite hole transport layer under vacuum conditions to obtain the perovskite-based photovoltaic, light-emitting and light detection multi-functional device.

12. The preparation method of claim 11, wherein a solvent in the precursor solution in step (2) is ethanol, and stannous chloride or stannic chloride has a concentration of 0.1-10 wt %, the amino-graphene quantum dot has a concentration of 0.01-1 wt %; and in the step (2), heat treatment refers to heating for 0.5-2 h at 180-270° C., and the ultraviolet ozonation treatment is performed for 5-15 min.

13. A preparation method of the light detection multi-functional device of claim 9, comprising the following steps:
(1) Cleaning of the transparent conductive glass
performing ultrasonic cleaning on a conductive glass, drying the conductive glass with nitrogen or compressed air, then performing surface cleaning treatment by an ultraviolet light to remove organic matters and enhance film-forming property;
(2) Preparation of the composite electron transport layer
Preparing a precursor solution from stannous chloride, stannic chloride or titanium tetrachloride, then adding amino-graphene quantum dots for mixing, and spin coating a mixed solution on the transparent conductive glass, then performing heat treatment, and performing ultraviolet ozonation treatment after cooling, where a dangling bond formed by the ozonation treatment may enhance the subsequent film-forming property;
(3) Preparation of the perovskite active layer
Spin coating a perovskite precursor solution on the composite electron transport layer, and dropwise adding an antisolvent for continuous spin coating when the solvent is wet, and performing heat treatment on the spin coated perovskite film;
(4) Preparation of the composite hole transport layer
Spin coating a mixed solution of spiro-OMeTAD and FN—Br on a surface of the perovskite active layer;
(5) Preparation of a metal electrode
Evaporating gold or silver on the composite hole transport layer under vacuum conditions to obtain the perovskite-based photovoltaic, light-emitting and light detection multi-functional device.

14. The preparation method of claim 13, wherein a solvent in the precursor solution in step (2) is ethanol, and stannous chloride or stannic chloride has a concentration of 0.1-10 wt %, the amino-graphene quantum dot has a concentration of 0.01-1 wt %; and in the step (2), heat treatment refers to heating for 0.5-2 h at 180-270° C., and the ultraviolet ozonation treatment is performed for 5-15 min.

15. A preparation method of the light detection multi-functional device of claim 1, comprising the following steps:
(1) Cleaning of the transparent conductive glass
performing ultrasonic cleaning on a conductive glass, drying the conductive glass with nitrogen or compressed air, then performing surface cleaning treatment by an ultraviolet light to remove organic matters and enhance film-forming property;
(2) Preparation of the composite electron transport layer
Preparing a precursor solution from stannous chloride, stannic chloride or titanium tetrachloride, then adding amino-graphene quantum dots for mixing, and spin coating a mixed solution on the transparent conductive glass, then performing heat treatment, and performing ultraviolet ozonation treatment after cooling, where a dangling bond formed by the ozonation treatment enhances the subsequent film-forming property;
(3) Preparation of the perovskite active layer
Spin coating a perovskite precursor solution on the composite electron transport layer, and dropwise adding an antisolvent for continuous spin coating when the solvent is wet, and performing heat treatment on the spin coated perovskite film;
(4) Preparation of the composite hole transport layer
Spin coating a mixed solution of spiro-OMeTAD and FN—Br on a surface of the perovskite active layer;
(5) Preparation of a metal electrode
Evaporating gold or silver on the composite hole transport layer under vacuum conditions to obtain the perovskite-based photovoltaic, light-emitting and light detection multi-functional device.

16. The preparation method of claim 15, wherein a solvent in the precursor solution is ethanol, and stannous chloride or stannic chloride has a concentration of 0.1%-10 wt %, the amino-graphene quantum dot has a concentration of 0.01-1 wt %; and in the step (2), heat treatment refers to heating for 0.5-2 h at 180-270° C., and the ultraviolet ozonation treatment is performed for 5-15 min.

17. The preparation method of claim 15, wherein the mixed solution of spiro-OMeTAD and FN—Br is obtained by dissolving spiro-OMeTAD and FN—Br powder into chlorobenzene, and spiro-OMeTAD has a concentration of 1-10 wt %, and FN—Br has a concentration of 0.01-1 wt %.

\* \* \* \* \*